United States Patent [19]
Jang

[11] Patent Number: 6,143,602
[45] Date of Patent: Nov. 7, 2000

[54] METHODS OF FORMING MEMORY DEVICE STORAGE CAPACITORS USING PROTRUDING CONTACT PLUGS

[75] Inventor: Soon-Kyou Jang, Seoul, Rep. of Korea

[73] Assignee: Samsung Electronics Co., Ltd., Rep. of Korea

[21] Appl. No.: 09/271,521

[22] Filed: Mar. 18, 1999

[30] Foreign Application Priority Data

Mar. 19, 1998 [KR] Rep. of Korea .......................... 98-9519

[51] Int. Cl.⁷ ................................................ H01L 21/8242
[52] U.S. Cl. ............................................ 438/253; 438/672
[58] Field of Search ...................................... 438/253–256, 438/381, 390–399, 3, 238, 672–675, 629

[56] References Cited

U.S. PATENT DOCUMENTS

| | | | |
|---|---|---|---|
| 5,726,086 | 3/1998 | Wu ........................................... | 438/253 |
| 5,863,835 | 1/1999 | Yoo et al. ................................ | 438/666 |

*Primary Examiner*—Jey Tsai
*Attorney, Agent, or Firm*—Myers Bigel Sibley & Sajovec

[57] ABSTRACT

Methods of forming memory device storage capacitors include the steps of forming a first electrically insulating layer on a semiconductor substrate containing active and inactive regions therein and then forming a first contact hole in the first electrically insulating layer to expose the active region. A step is also performed to form a first electrically conductive contact plug in the first contact hole and in ohmic contact with the active region. A second electrically insulating layer is then formed on the first electrically insulating layer. Next, a second contact hole is formed in the second electrically insulating layer, to expose the first electrically conductive contact plug. A second electrically conductive contact plug is then formed in the second contact hole and in ohmic contact with the first electrically conductive contact plug. A step is then performed to etch back the second electrically insulating layer to expose sidewalls of the second electrically conductive contact plug. Then, an electrically conductive material is conformally deposited on the protruding second electrically conductive contact plug. Because of the conformal deposition, the thickness of the deposited electrically conductive material is increased in a region closely surrounding a perimeter of the protruding contact plug. This increase in thickness provides an over-etch margin which lessens the likelihood that a reduced-area contact will be formed between the lower capacitor electrode and the second electrically conductive contact plug when the lower capacitor electrode is patterned.

7 Claims, 5 Drawing Sheets

METHODS OF FORMING MEMORY DEVICE STORAGE CAPACITORS USING PROTRUDING CONTACT PLUGS

RELATED APPLICATION

This application is related to Korean Application No. 98-9519, filed Mar. 19, 1998, the disclosure of which is hereby incorporated herein by reference.

FIELD OF THE INVENTION

This invention relates to integrated circuit device fabrication methods, and more particularly to integrated circuit memory device fabrication methods.

BACKGROUND OF THE INVENTION

Because of the ongoing need to increase the capacity of memory devices such as dynamic random access memory (DRAM) devices, there is a concomitant need to develop methods of fabricating memory devices having reduced unit cell size. Unfortunately, reducing the unit cell size of a memory device typically results in a reduction in the capacitance of storage capacitors therein and this reduction can be detrimental to the reliability of the memory device (e.g., data retention reliability). Accordingly, techniques to reduce unit cell size typically include steps to preserve capacitance levels by using dielectric materials with high dielectric coefficients and/or by forming capacitor electrodes having threedimensional shapes which preserve overall surface area.

One conventional method of forming a storage capacitor for a unit cell DRAM device is illustrated by FIG. 1. According to this method, an active portion of a semiconductor substrate 2 is defined between adjacent field oxide isolation regions 4. A plurality of insulated gate electrodes 6–11 are also formed on the substrate 2 and these gate electrodes may extend in parallel across an array of memory cells as word lines. Source/drain regions (not shown) may be formed in the active portion of the substrate 2 between adjacent gate electrodes. A first electrically insulating layer 12 (e.g., oxide layer) is also formed on the substrate. First contact holes may be formed in the first electrically insulating layer 12 and these first contact holes may be filled by a plurality of contact plugs (e.g., polysilicon contact plugs) 14–16. A second electrically insulating layer may then be formed on the first electrically insulating layer. This second electrically insulating layer may comprise an oxide layer 18 and a silicon nitride layer 20. Second contact holes 22a and 22b may then be formed in the second electrically insulating layer, as illustrated. Next, a blanket layer of polycrystalline silicon may be deposited on the second electrically insulating layer and in the contact holes. This blanket layer may then be patterned to define a plurality of storage nodes (i.e., lower capacitor electrodes of storage capacitors). Unfortunately, during this patterning step which typically involves etching back the blanket layer to expose the silicon nitride layer 20, an over-etch condition may take place and result in the formation of a reduce area region 25 in the contact hole. The size of this reduced area region may increase as the degree of photolithographic misalignment during the patterning step increases. As will be understood by those skilled in the art, this reduced area region 25 may degrade the electrical characteristics of the storage capacitor.

Accordingly, notwithstanding the above-described method, there continues to be a need for improved methods of forming integrated circuit memory devices.

SUMMARY OF THE INVENTION

It is therefore an object of the present invention to provide improved methods of forming integrated circuit memory devices.

It is another object of the present invention to provide methods of forming memory devices which inhibit degradation of storage capacitor electrical characteristics when photolithographic alignment errors occur during processing.

These and other objects, advantages and features of the present invention are provided by methods of forming integrated circuit memory devices which in one embodiment comprise the steps of forming a first electrically insulating layer on a semiconductor substrate containing active and inactive regions therein and then forming a first contact hole in the first electrically insulating layer to expose the active region. A step is also performed to form a first electrically conductive contact plug in the first contact hole and in ohmic contact with the active region. A second electrically insulating layer is then formed on the first electrically insulating layer and on the first electrically conductive contact plug. Next, a second contact hole is formed in the second electrically insulating layer, to expose the first electrically conductive contact plug. A second electrically conductive contact plug is then formed in the second contact hole and in ohmic contact with the first electrically conductive contact plug. To inhibit the likelihood that photolithographic alignment errors may adversely affect the reliability of an electrical contact between the second electrically conductive contact plug and subsequently formed regions, a step is then performed to etch back the second electrically insulating layer to expose sidewalls of the second electrically conductive contact plug. Then, an electrically conductive material is conformally deposited on the protruding second electrically conductive contact plug. An etching step is then performed to define a lower capacitor electrode of a memory cell storage capacitor which is electrically connected to the active region by the first and second electrically conductive contact plugs. Because of the conformal deposition, the thickness of the deposited electrically conductive material is increased in a region surrounding the protruding contact plug. This increase in thickness provides an over-etch margin which lessens the likelihood that a reduced-area contact will be formed between the lower capacitor electrode and the second electrically conductive contact plug, when the lower capacitor electrode is patterned.

DESCRIPTION OF PREFERRED EMBODIMENTS

Figure 1:
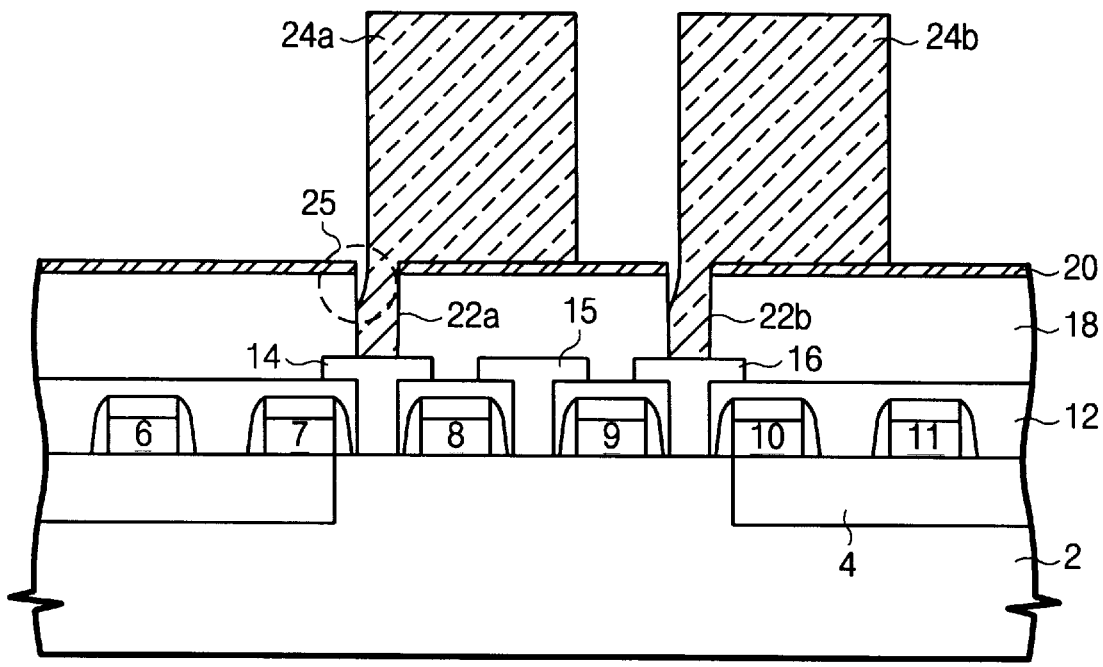
FIG. 1 is a cross-sectional view of a dynamic random access memory (DRAM) device according to the prior art.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 2:
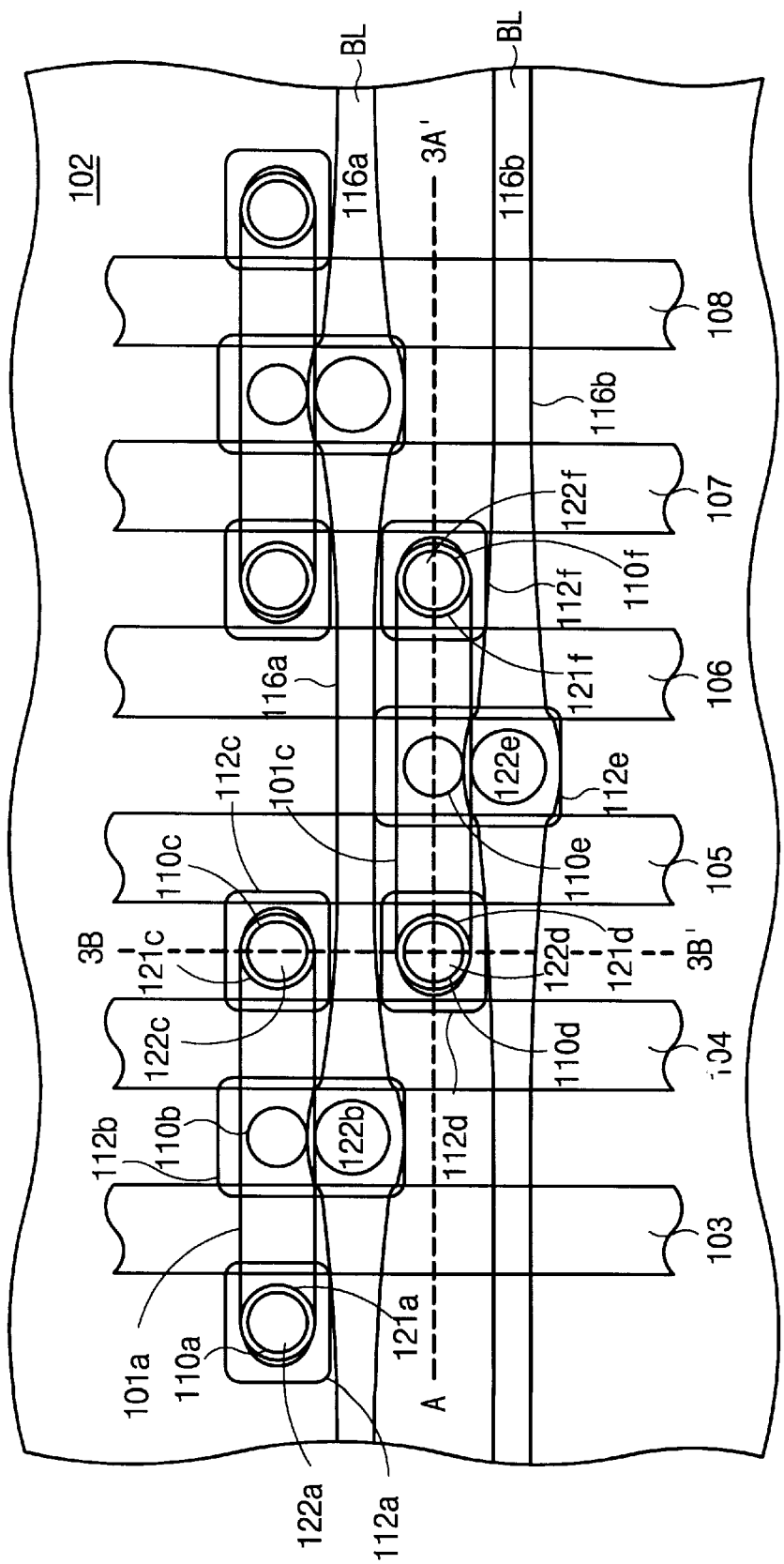
FIG. 2 is a plan layout view of a preferred DRAM device at a first intermediate stage of fabrication when a method according to the present invention is performed.
Figure 3A:
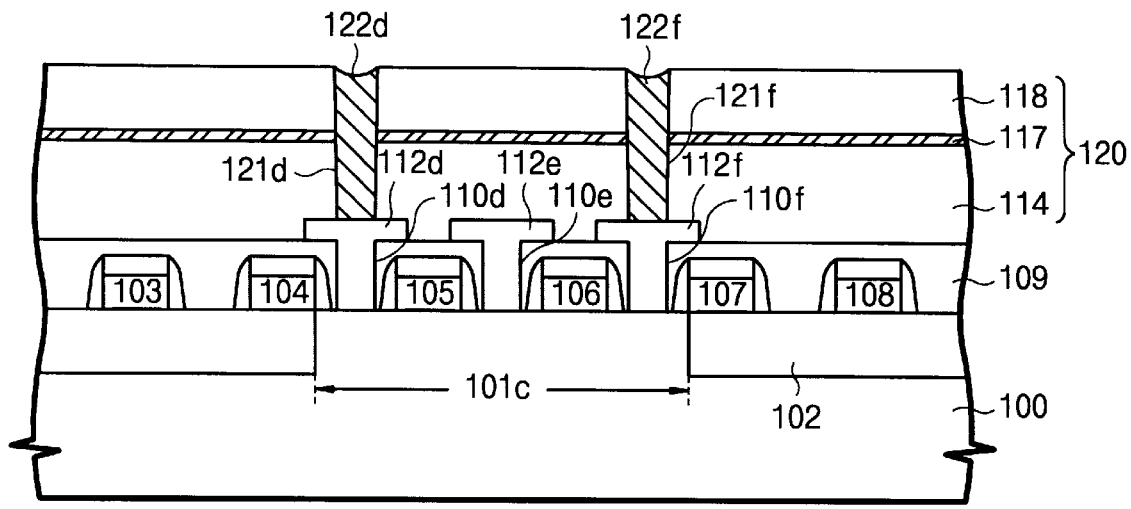
FIG. 3A is a cross-sectional view of the device of FIG. 2, taken along line 3A–3A'.
Figure 3B:
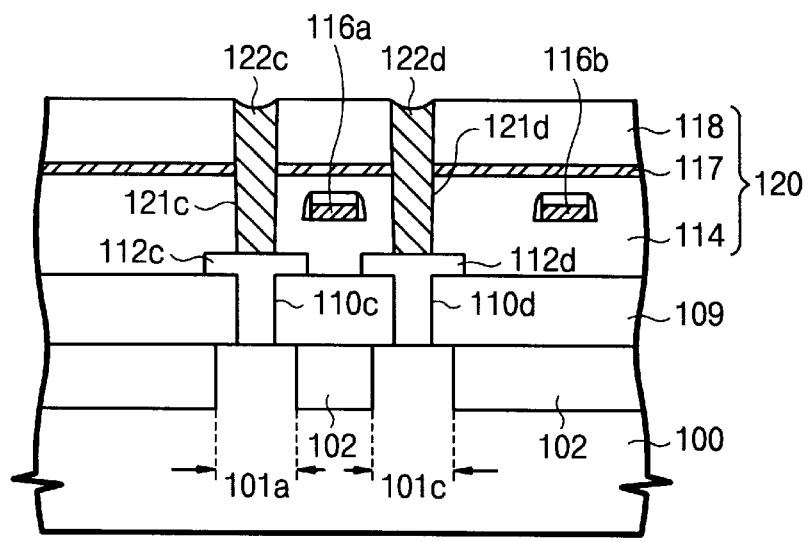
FIG. 3B is a cross-sectional view of the device of FIG. 2, taken along line 3B–3B'.

Referring now to FIGS. 2 and 3A–3B, a preferred dynamic random access memory (DRAM) device at an intermediate stage of fabrication will now be described. In particular, FIGS. 3A and 3B represent cross-sectional views of the device of FIG. 2 taken along lines 3A–3A' (bit line direction) and lines 3B–3B' (word line direction), respectively. In FIGS. 2 and 3A–3B, regions 101a–101c represent active portions of a semiconductor substrate 100 (e.g., source/drain regions) and regions 102 represent isolation regions within the substrate 100. These isolation regions 102 may constitute field oxide isolation regions which are formed using conventional shallow trench isolation (STI) techniques. A first electrically insulating layer 109 is also formed on the face of the substrate 100. As illustrated, the first electrically insulating layer 109 covers a plurality of insulated gate electrodes 103–108 which may represent the gate electrodes of access transistors within respective DRAM cells. As illustrated best by FIG. 2, these gate electrodes may extend in parallel across an array of memory cells as respective word lines. Contact holes 110a–110f are also formed in the first electrically insulating layer 109, as illustrated. In addition, bit line contact pads 112b and 112e are formed in contact holes 110b and 110e, respectively, and storage node contact pads 112a, 112c, 112d and 112f are formed in contact holes 110a, 110c, 110d and 110f, respectively.

A second electrically insulating layer 120 is also provided on the first electrically insulating layer 109. As described more fully hereinbelow, the second electrically insulating layer 120 may comprise a composite of a first oxide layer 114, an intermediate silicon nitride layer 117 and a second oxide layer 118 as an oxide-nitride-oxide (ONO) composite insulating layer. Using conventional techniques, bit lines 116a and 116b may be formed in the second electrically insulating layer 120.

Bit line contact holes 121b and 121e and storage node contact holes 121a, 121c, 121d and 121f are also provided in the second electrically insulating layer 120. As illustrated best by FIG. 2, the bit line contact holes are filled with bit line contact plugs 122b and 122e and as best illustrated by FIGS. 3A–3B, the storage node contact holes 121a, 121c, 121d and 121f are filled with storage node contact plugs 122a, 122c, 122d and 122f.

Referring now specifically to FIGS. 3A and 3B, a preferred method of forming the illustrated memory device may include the steps of forming a first electrically insulating layer 109 on a semiconductor substrate 100 containing active regions 101a, 101c and inactive regions 102 therein. Referring now to a specific portion of the memory device, a first contact hole (e.g., 110d) is then formed in the first electrically insulating layer 109, to expose the active region 101c. A first electrically conductive contact plug 112d comprising a material such as polycrystalline silicon is then formed in the first contact hole 110d, in ohmic contact with the active region 101c. Conventional deposition and patterning steps may be used to define the contact plug. A second electrically insulating layer 120 is then formed on the first electrically insulating layer 109 and on the first electrically conductive contact plug 112d. The second electrically insulating layer 120 may comprise a composite of a first oxide layer 114, an intermediate silicon nitride layer 117 and a second oxide layer 118 having thickness in a range between 500 and 1500 Å.

A second contact hole 121d may then be formed in the second electrically insulating layer 120, to expose the first electrically conductive contact plug 112d. Next, a second electrically conductive contact plug 122d is formed in the second contact hole 121d and in ohmic contact with the first electrically conductive contact plug 112d. According to a preferred aspect of this step, the second electrically conductive contact plug 122d may comprise a material selected from the group consisting of polycrystalline silicon, tungsten or titanium nitride. As will be understood by those skilled in the art, the material may be deposited and then planarized using conventional techniques to form the second electrically conductive contact plug 122d. These above steps also apply to other portions of the memory device illustrated by FIGS. 3A and 3B.

Figure 4:
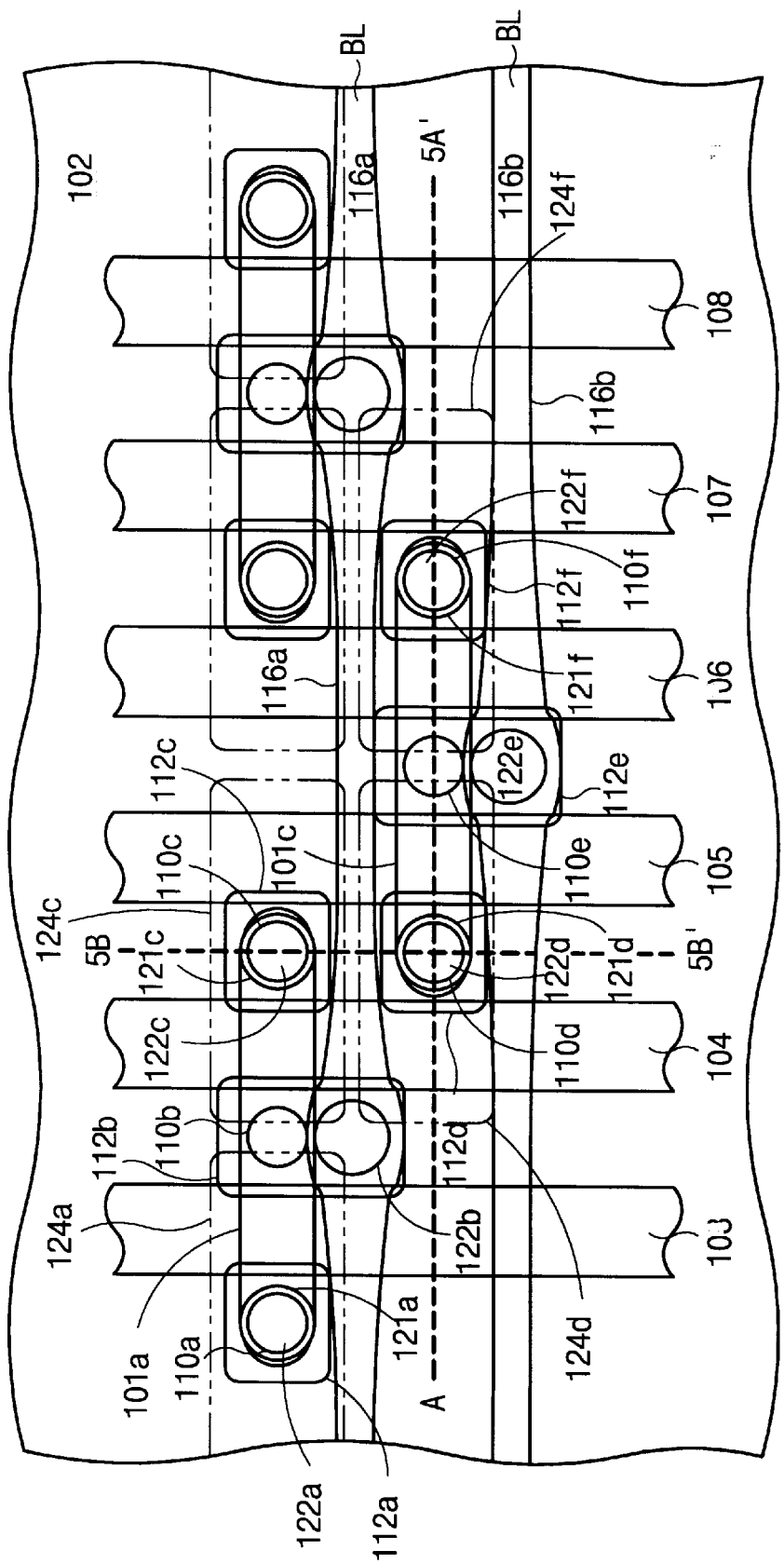
FIG. 4 is a plan layout view of a preferred DRAM device at a second intermediate stage of fabrication when a method according to the present invention is performed.
Figure 5A:
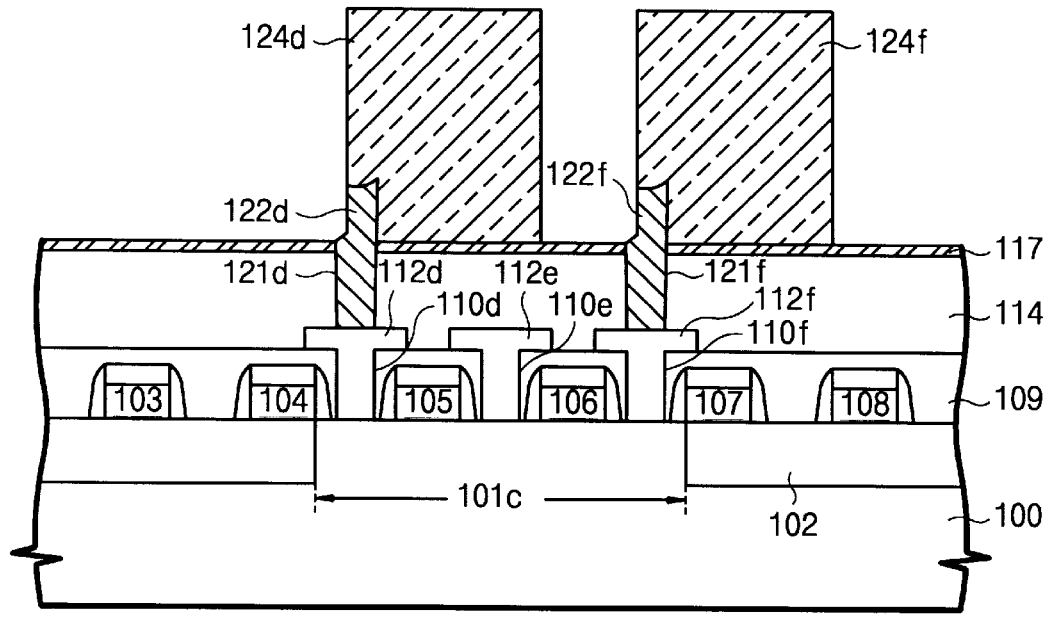
FIG. 5A is a cross-sectional view of the device of FIG. 4, taken along line 5A–5A'.
Figure 5B:
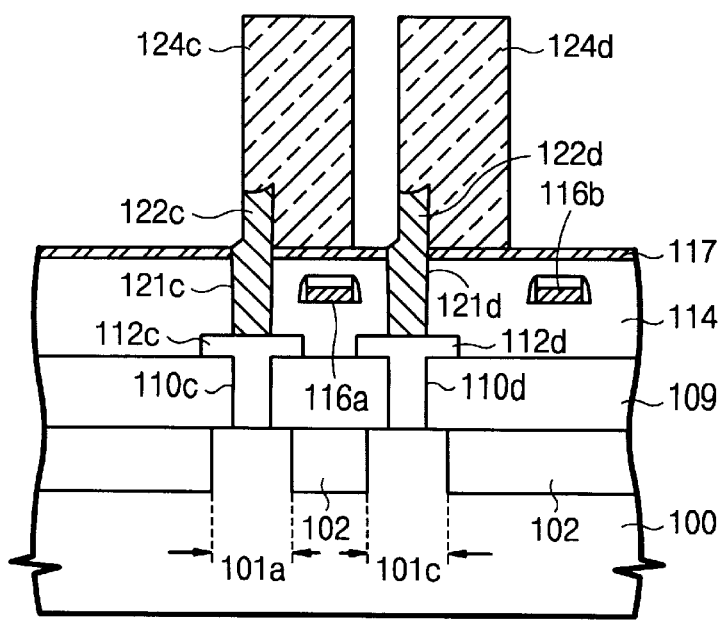
FIG. 5B is a cross-sectional view of the device of FIG. 4, taken along line 5B–5B'.

Referring now to FIGS. 4 and 5A–5B, the preferred dynamic random access memory (DRAM) device at a latter stage of fabrication (relative to the device of FIGS. 2 and 3A–3B) will now be described. In particular, FIGS. 5A and 5B represent cross-sectional views of the device of FIG. 4 taken along lines 5A–5A' (bit line direction) and lines 5B–5B' (word line direction), respectively. In FIGS. 4 and 5A–5B, regions 124a, 124c, 124d and 124f represent storage nodes (e.g., lower electrodes of storage capacitors) which are electrically coupled to active regions of respective memory cells via the contact plugs. Referring now to FIGS. 5A–5B, an etch-back step is performed on the intermediate structures of FIGS. 3A–3B. In particular, a step is performed to etch back the second electrically insulating layer 120 to expose sidewalls of the second electrically conductive contact plug 122d. Here, the etch back step is preferably performed using the intermediate silicon nitride layer 117 as an etch stop layer. Upon completion of this step, the second electrically conductive contact plug 122d will protrude from the surface of the silicon nitride layer 117, as illustrated.

Next, a layer of polycrystalline silicon preferably having a thickness in a range between 8000 and 10000 Å is conformally deposited on the silicon nitride layer 117 and on the contact plugs. Because of this conformal deposition step, the thickness of the deposited polycrystalline silicon layer will be increased in a region closely surrounding the perimeter of the protruding contact plug 122d. This increase in thickness provides an over-etch margin which lessens the likelihood that a reduced-area contact will be formed between the lower capacitor electrode and the second electrically conductive contact plug 122d, when the lower capacitor electrode is patterned. For example, the lower capacitor electrode may be formed by etching back the relatively thick polycrystalline silicon layer, using an etching mask (not shown) and the silicon nitride layer 117 as an etch-stop layer. Here, the silicon nitride layer 117 will typically be fully exposed by the etch-back step before any opening like the one illustrated by region 25 in FIG. 1 is formed. In other words, by conformally depositing the thick polycrystalline silicon layer on a protruding contact plug as opposed to a planarized contact plug, degradation of storage capacitor electrical characteristics can be inhibited even when photolithographic alignment errors occur during processing. According to another aspect of the present invention, the electrically conductive contact plug 122 and the capacitor electrode 124d may comprise first and second different materials, respectively, with the first material being less susceptible to etching relative to the second material when both the first and second materials are simultaneously exposed to an etchant In the drawings and specification, there have been disclosed typical preferred embodiments of the invention and, although specific terms are employed, they are used in a generic and descriptive sense only and not for purposes of limitation, the scope of the invention being set forth in the following claims.

What is claim is:

1. A method of forming a integrated circuit memory device, comprising the steps of:

forming a first electrically insulating layer on a semiconductor substrate containing active and inactive regions therein;

forming a first contact hole in the first electrically insulating layer, to expose the active region;

forming a first electrically conductive contact plug in the first contact hole and in contact with the active region;

forming a second electrically insulating layer on the first electrically insulating layer and on the first electrically conductive contact plug, wherein the second electrically insulating layer comprises a first interdielectric layer, an intermediate insulating layer and a second interdielectric layer;

forming a second contact hole in the second electrically insulating layer, to expose the first electrically conductive contact plug;

forming a second electrically conductive contact plug in the second contact hole and in contact with the first electrically conductive contact plug;

etching back the second interdielectric layer using the intermediate insulating layer as an etch stop layer to expose sidewalls of the second electrically conductive contact plug; and forming a capacitor electrode on the second electrically conductive contact plug and in contact with sidewalls thereof.

2. The method of claim 1, wherein the second electrically conductive contact plug comprises a material selected from the group consisting of polycrystalline silicon, tungsten and titanium nitride; and wherein the capacitor electrode comprises polycrystalline silicon.

3. The method of claim 1, wherein the second electrically conductive contact plug and the capacitor electrode comprise first and second materials, respectively, and wherein the first material is less susceptible to being etched by a first etchant than the second material when both the first and second materials are simultaneously exposed to the first etchant.

4. The method of claim 1, wherein the second oxide layer has a thickness in a range between 500 and 1500 Å.

5. The method of claim 1, wherein the sidewall height of the contact plug exposed is in a range between 500 and 1500 Å.

6. The method of claim 1, wherein the sidewall height of the contact plug layer on the top surface or the entire surface of the exposed contact plug having the sidewalls.

7. The method of claim 4, wherein the capacitor electrode has a thickness in a range between 8000 and 10000 Å.

* * * * *